United States Patent
Choi et al.

(10) Patent No.: US 12,287,452 B2
(45) Date of Patent: Apr. 29, 2025

(54) MEMBER AND ELECTRONIC DEVICE INCLUDING THE SAME

(71) Applicant: Samsung Electronics Co., Ltd., Gyeonggi-do (KR)

(72) Inventors: Jongmun Choi, Gyeonggi-do (KR); Kyunghyun Kim, Gyeonggi-do (KR); Hyunsuk Choi, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 513 days.

(21) Appl. No.: 17/709,837

(22) Filed: Mar. 31, 2022

(65) Prior Publication Data

US 2023/0031125 A1 Feb. 2, 2023

Related U.S. Application Data

(63) Continuation of application No. PCT/KR2022/003681, filed on Mar. 16, 2022.

(30) Foreign Application Priority Data

Aug. 2, 2021 (KR) ........................ 10-2021-0101286

(51) Int. Cl.
G02B 1/115 (2015.01)
G02B 5/00 (2006.01)

(52) U.S. Cl.
CPC .............. *G02B 1/115* (2013.01); *G02B 5/003* (2013.01)

(58) Field of Classification Search
CPC ........ G02B 1/115; G02B 5/003; G02B 5/286; G02B 5/32; H05K 5/0243

(Continued)

(56) References Cited

U.S. PATENT DOCUMENTS

2002/0001724 A1 1/2002 Anderson et al.
2016/0065704 A1 3/2016 Yang
(Continued)

FOREIGN PATENT DOCUMENTS

CN 110612001 A 12/2019
JP 2013-137383 A 7/2013
(Continued)

OTHER PUBLICATIONS

International Search Report dated Jun. 27, 2022.
Extended European Search Report dated Sep. 27, 2024.

*Primary Examiner* — Brandi N Thomas
*Assistant Examiner* — Boutsikaris Leonidas
(74) *Attorney, Agent, or Firm* — Cha & Reiter, LLC (57) ABSTRACT

An electronic device and ornamental member for the same are disclosed herein. The electronic devices includes a housing, a front plate disposed on one surface of the housing, and a rear plate disposed on a rear surface of the housing, wherein one of the plates includes the ornamental member, which includes: a base film attached to one surface of a transparent plate and configured to at least partially transmit light, an ultra-violet (UV) molding layer formed on a surface of the base film, and a plurality of refractive layers sequentially stacked on a surface of the UV molding layer, wherein at least one of the plurality of refractive layers is formed to have a different refractive index and a different surface area from a remainder of the refractive layers.

20 Claims, 7 Drawing Sheets

(58) Field of Classification Search
USPC .......................................................... 359/359
See application file for complete search history.

(56) References Cited

U.S. PATENT DOCUMENTS

| | | |
|---|---|---|
| 2016/0255735 A1 | 9/2016 | Han et al. |
| 2017/0146710 A1 | 5/2017 | Jin et al. |
| 2019/0383977 A1 | 12/2019 | Bluck et al. |
| 2020/0045155 A1 | 2/2020 | Ha et al. |
| 2020/0153951 A1 | 5/2020 | Kajioka et al. |
| 2021/0127509 A1* | 4/2021 | Liao ........................ B32B 27/36 |
| 2021/0250434 A1* | 8/2021 | Choi ....................... G06F 1/1626 |
| 2022/0024815 A1* | 1/2022 | Kim .................... C03C 17/3649 |

FOREIGN PATENT DOCUMENTS

| | | | |
|---|---|---|---|
| JP | 2016-51888 A | | 4/2016 |
| KR | 10-2011-0045150 A | | 5/2011 |
| KR | 10-1277727 B1 | | 6/2013 |
| KR | 10-2013-0109455 A | | 10/2013 |
| KR | 20130109455 A | * | 10/2013 |
| KR | 10-2016-0105110 A | | 9/2016 |
| KR | 10-2017-0122989 A | | 11/2017 |
| KR | 10-2025788 B1 | | 9/2019 |
| KR | 10-2020-0015046 A | | 2/2020 |
| KR | 10-2020-0027182 A | | 3/2020 |
| KR | 10-2020-0072216 A | | 6/2020 |
| KR | 20200072216 A | * | 6/2020 |
| KR | 10-2020-0119145 A | | 10/2020 |
| KR | 10-2021-0045292 A | | 4/2021 |
| KR | 20200027182 A | * | 3/2022 |

* cited by examiner

MEMBER AND ELECTRONIC DEVICE INCLUDING THE SAME

CROSS-REFERENCE TO RELATED APPLICATION(S)

This application is a Continuation of and claims priority under 35 U.S.C. § 120 to PCT International Application No. PCT/KR2022/003681, which was filed on Mar. 16, 2022, and claims priority to Korean Patent Application No. 10-2021-0101286, filed on Aug. 2, 2021, in the Korean Intellectual Property Office, the disclosures of which are incorporated by reference herein their entirety.

TECHNICAL FIELD

Certain embodiments of the disclosure relate to electronic devices, and, more particularly, to external members providing aesthetics to electronic device housings.

DESCRIPTION OF RELATED ART

With developments in information technology, communication technology and semiconductor technology, the world has seen rapid increase in distribution and usage of electronic devices. Recent electronic devices are highly portable, and thus, able to be carried on the person of a user, giving them constant access to communication functions. Furthermore, the devices may store multimedia information. These devices are highly integrated in terms of functionality. With the advent of commonplace high-speed, high-volume wireless network access, electronic devices (such as portable terminals) are able to perform an ever-increasing range of integrated functions, such as media entertainment, videogaming, multimedia function and playback, secure functions such as mobile online banking, scheduling, electronic wallets and payment, etc. As these devices, such as smartphones, are often slim and compact, user demand now includes luxurious design specifications and aesthetics for these devices.

As a consequence of this type of user demand, various techniques have been developed to enhance the color, texture and shape of the electronic devices. For example, a light interference effect (e.g., a hologram) may be applied to a surface of an electronic device to enhance aesthetic appeal. This light interference effect may include formation of micro-patterns on the surface of a synthetic resin or ultra-violet-cured film. The resulting film is attached to a surface of the device, often formed by injection molding, or via a glass plate, and may thereby impart an aesthetic ornamental effect to the device exterior.

The above-described information may be provided as background for the purpose of helping understanding of the disclosure. No claim or determination is made as to whether any of the foregoing is applicable as background art in relation to the disclosure.

SUMMARY

However, there may be limits to the optical colors or patterns that may be implemented. This may result in an inability to meet consumer demand with regard to aesthetic appeal for electronic devices.

Certain embodiments of the disclosure aim to address the foregoing issues and/or drawbacks and provide advantages described below, and thereby provide an ornamental member capable of diversifying the range exterior colors or patterns applicable to an electronic device.

Other aspects according to certain embodiments will be suggested through in the following detailed description and would be partially apparent from the description or appreciated through the suggested embodiments.

In certain embodiments of the disclosure, an electronic device is disclosed, including a housing, a front plate disposed on one surface of the housing, and a rear plate disposed on a rear surface of the housing, wherein at least one of the front plate and the rear plate includes: a transparent plate configured to at least partially transmit light, a base film attached to one surface of the transparent plate and configured to at least partially transmit light, an ultra-violet (UV) molding layer formed on a surface of the base film, a plurality of refractive layers sequentially stacked on a surface of the UV molding layer, and wherein at least one of the plurality of refractive layers is formed to have a different refractive index and a different surface area from a remainder of the refractive layers.

In certain embodiments of the disclosure, an ornamental member for an electronic device is disclosed, including: a base film, an ultra-violet (UV) molding layer formed on a surface of the base film, and a plurality of refractive layers sequentially stacked on a surface of the UV molding layer, wherein at least one of the plurality of refractive layers is formed to have a different refractive index and a different surface area from a remainder of the plurality of refractive layers According to certain embodiments of the disclosure, in the ornamental member and/or the electronic device including the same, at least one of the refractive layers is formed to have a refractive index or surface area different from that of another refractive layer, allowing the reflectance for incident light or the wavelength of the reflected light to be partially different from the other portions. For example, it is possible to implement various colors or patterns on the exterior of the ornamental member and/or the electronic device, with the partial differences in reflectance and the wavelength of reflected light. This may enhance the aesthetic appeal of the electronic device to consumers and users. Other various effects may be provided directly or indirectly in the disclosure.

BRIEF DESCRIPTION OF THE DRAWINGS

The foregoing and other aspects, configurations, and/or advantages of certain embodiments of the disclosure will be more apparent from the following detailed description taken in conjunction with the accompanying drawings.

Throughout the drawings, like reference numerals may be assigned to like parts, components, and/or structures.

DETAILED DESCRIPTION

The following description taken in conjunction with the accompanying drawings may provide an understanding of various example implementations of the disclosure, including claims and their equivalents. The specific embodiments disclosed in the following description entail various specific details to aid understanding, but are regarded as one of certain embodiments. Accordingly, it will be apparent to those skilled in the art that various changes and modifications may be made to the various implementations described in the disclosure without departing from the disclosure. Further, descriptions of well-known functions and configurations may be omitted for clarity and brevity.

The terms and words used in the following description and claims are not limited to the bibliographical meaning, but may be used to clearly and consistently describe the certain embodiments of the disclosure. Therefore, it will be apparent to those skilled in the art that the following description of various implementations of the disclosure is provided only for the purpose of description, not for the purpose of limiting the disclosure defined via the claims and equivalent thereto.

The singular forms "a," "an," and "the" are intended to include the plural forms as well, unless the context clearly indicates otherwise. Thus, as an example, "a component surface" may be interpreted as including one or more of the surfaces of a component.

The electronic device according to certain embodiments may be one of various types of devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that certain embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Certain embodiments as set forth herein may be implemented as software (e.g., the program) including one or more instructions that are stored in a storage medium (e.g., internal memory or external memory) that is readable by a machine (e.g., the electronic device). For example, a processor (e.g., the processor) of the machine (e.g., the electronic device) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to certain embodiments of the disclosure may be included and provided in a computer program product. The computer program products may be traded as commodities between sellers and buyers. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to certain embodiments, each component (e.g., a module or a program) of the above-described components may include a single entity or multiple entities. Some of the plurality of entities may be separately disposed in different components. According to certain embodiments, one or more of the above-described components may be omitted, or one or more other components may be added. Alternatively or additionally, a plurality of components (e.g., modules or programs) may be integrated into a single component. In such a case, according to certain embodiments, the integrated component may still perform one or more functions of each of the plurality of components in the same or similar manner as they are performed by a corresponding one of the plurality of components before the integration. According to certain embodiments, operations performed by the module, the program, or another component may be carried out sequentially, in parallel, repeatedly, or heuristically, or one or more of the operations may be executed in a different order or omitted, or one or more other operations may be added.

Figure 1:
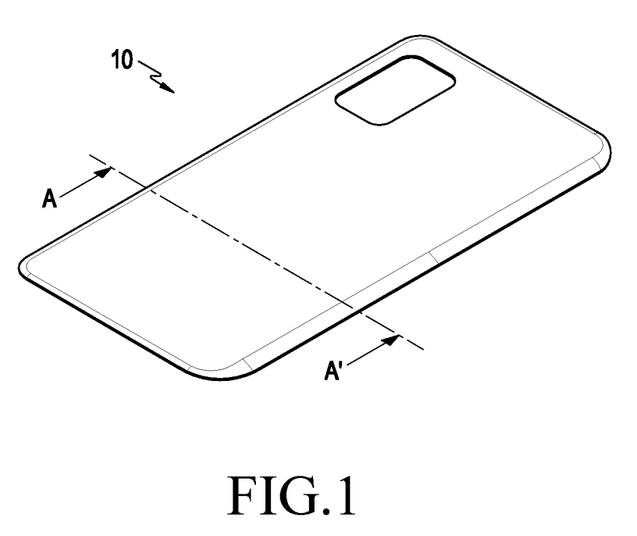
FIG. 1 is a perspective view illustrating an ornamental member according to certain embodiments of the disclosure.
Figure 2:
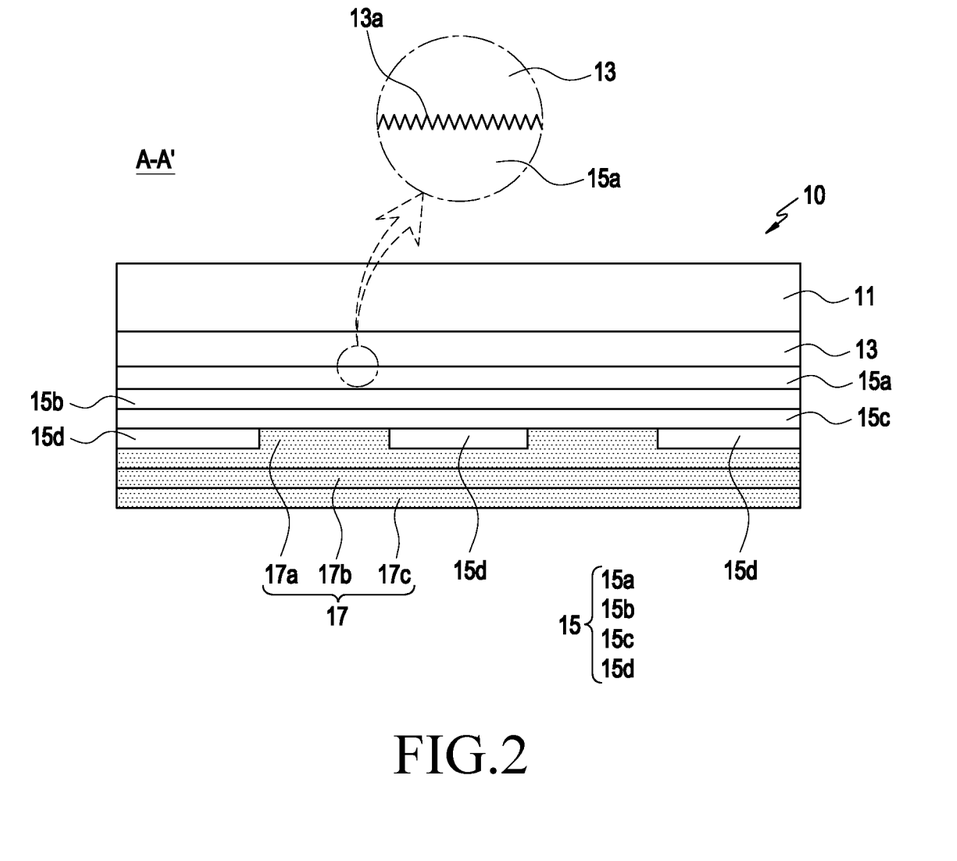
FIG. 2 is a cross-sectional view illustrating a portion of an ornamental member, taken along line A-A' of FIG. 1, according to certain embodiments of the disclosure.

FIG. 1 is a perspective view illustrating an ornamental member 10 (e.g., the rear plate 111 of FIG. 8) according to certain embodiments of the disclosure. FIG. 2 is a cross-sectional view illustrating a portion of an ornamental member 10, taken along line A-A' of FIG. 1, according to certain embodiments of the disclosure.

Referring to FIGS. 1 and 2, an ornamental member 10 may include a base film 11, an ultraviolet (UV) molding layer 13, and/or a plurality of refractive layers 15, 15a, 15b, 15c, and 15d sequentially stacked on a surface of the UV molding layer 13. According to certain embodiments, the ornamental member 10 may further include light blocking layers 17, 17a, 17b, and 17c. The light blocking layers 17, 17a, 17b, and 17c may be disposed to face the base film 11 or the UV molding layer 13, with, e.g., the refractive layers 15, 15a, 15b, 15c, and 15d interposed therebetween. According to an embodiment, the ornamental member 10 may further include a transparent plate (e.g., a polymer plate or glass plate as the transparent plate 29 of FIG. 5 or 6), and the base film 11 may be attached on one surface (e.g., the inner surface) of the transparent plate 29. The transparent plate 29 may be disposed so as to form an exterior of the ornamental member and may be implemented so as to substantially transmit light. In some embodiments, the transparent plate 29 and the base film 11 may be replaced with each other. For example, the base film 11 may be omitted, and the UV molding layer 13 may be formed directly on the inner surface of the transparent plate 29. The transparent plate 29 may be omitted, and the base film 11 itself may provide the structure and function otherwise provided by the transparent plate 29.

According to certain embodiments, the transparent plate 29 may be formed on the uppermost layer of the base film 11 to protect the user from injury in the event that the glass included in the base film 11 is shattered. In an embodiment, at least a portion of the transparent plate 29 may be exposed to the external environment of the ornamental member 20. According to certain embodiments, the transparent plate 29 may include polyethylene terephthalate (PET), polypropylene (PP), polyurethane (PU), or polyolefin (PO). In an embodiment, the transparent plate 29 may include a glass material, or may be implemented using a film layer or a coating layer. In an embodiment, the transparent plate 29 may include a flexible material. The transparent plate 29 may be formed of a transparent material having high light transmittance.

According to certain embodiments, the base film 11 may include a polymer material, e.g., polyethylene terephthalate (PET). The base film 11 may be manufactured with a thin thickness, allowing the base film 11 to be freely deformable into curved and/or flat shapes. In an embodiment, when the transparent plate 29 is omitted such that the base film 11 provides the structure and function of the transparent plate 29, the thickness of the base film 11 may be increased and the flexibility provided may be reduced. In another embodiment, the base film 11 may be substantially transparent or colored in a designated color. However, even when colored, the base film may transmit at least portion of the incident light even in the colored state.

According to certain embodiments, the UV molding layer 13 may be formed by applying a fused UV-curable resin onto the inner surface of the base film 11 (or the transparent plate 29 of FIG. 5) and curing the same, and the UV molding layer 13 may thus transmit a portion of the incident light or reflect another portion thereof. In the illustrated embodiment, the UV molding layer 13 is shown as formed on one entire surface of the base film 11. However, certain embodiments of the disclosure are not limited thereto. A portion with the UV molding layer 13 and another portion with no UV molding layer 13 may be combined to implement ornamental patterns, such as various designs, characters, and/or figures.

According to certain embodiments, the UV molding layer 13 may include an optical pattern 13a (e.g., such as a hologram pattern or hairline pattern) formed on the surface thereof. The optical pattern 13a may be implemented using, e.g., micro grooves, and the trajectories in which the micro grooves extend, directions of the arrangements, differences in depth, and/or the inclination angles of the inclined surface may be combined to provide various ornamental patterns or visual effects. For example, the optical pattern 13a may refract or scatter the incident light, thereby creating an optical illusion which causes the ornamental member 10 to indicate a color different from its originally applied color.

According to certain embodiments, the refractive layers 15, 15a, 15b, 15c, and 15d may transmit at least a portion of the incident light while refracting or reflecting another portion of the incident light. The transmittance, refractive index, and/or reflectance of the refractive layers 15, 15a, 15b, 15c, and 15d may be determined by the materials (or components) or thicknesses of the refractive layers 15, 15a, 15b, 15c, and 15d. For example, when the components are identical, and as the thicknesses of the refractive layers 15, 15a, 15b, 15c, and 15d increase, their transmittance may decrease while the reflectance may increase. In some embodiments, any one of the refractive layers 15, 15a, 15b, 15c, and 15d may have a different thickness from a remainder of the refractive layers 15, 15a, 15b, 15c, and 15d, and a portion of one of the refractive layers 15, 15a, 15b, 15c, and 15d may have a different thickness from the remaining portion thereof. The refractive layers 15, 15a, 15b, 15c, and 15d may be designed to have various thicknesses or components in consideration of the transmittance, refractive index, and/or reflectance.

According to certain embodiments, at least one (e.g., the fourth refractive layer 15d) of the refractive layers 15, 15a, 15b, 15c, and 15d may be formed with a different refractive index or a different surface area as compared to another refractive layer. In the illustrated embodiment, the refractive layers 15, 15a, 15b, 15c, and 15d and/or the ornamental member 10 may include four refractive layers, and in the illustrated example, the fourth refractive layer 15d may be formed with a different surface area (or a different thickness) from the first refractive layer 15a, the second refractive layer 15b, and/or the third refractive layer 15c. However, certain embodiments of the disclosure are not limited thereto. The four refractive layers 15, 15a, 15b, 15c, and 15d may each be formed with different refractive indexes and different surface areas. At least two refractive layers (e.g., the third refractive layer 15c and the fourth refractive layer 15d) abutting each other may have different surface areas relative to one another.

According to certain embodiments, the refractive layers 15, 15a, 15b, 15c, and 15d may be formed with different patterns or may have different surface areas. According to an embodiment, the refractive layers 15, 15a, 15b, 15c, and 15d may be formed with the same pattern, and the pattern of each of the refractive layers 15, 15a, 15b, 15c, and 15d may be disposed in a different position so as to be misaligned with one another. For example, when viewed from the outer surface of the base film 11 of FIG. 2, the first refractive layer 15a and the second refractive layer 15b may have square patterns which are identical in shape, but the two square patterns may be disposed in positions such that they partially overlap, or do not overlap each other at all.

According to certain embodiments, the patterns of the refractive layers 15, 15a, 15b, 15c, and 15d may be formed by printing, drying, and/or removing (e.g., washing) an etching ink. The etching ink may be applied or printed in a designated pattern on a surface of any one of the refractive layers 15, 15a, 15b, 15c, and 15d through, for example, silk-screening. The etching ink may partially alter the refractive layers 15, 15a, 15b, 15c, and 15d in the printed area, and, in the drying and/or washing process, part of the refractive layers 15, 15a, 15b, 15c, and 15d may be thereby removed along with the etching ink.

According to certain embodiments, the etching ink may include different components depending on the components of the refractive layers 15, 15a, 15b, 15c, and 15d. As is described below, when the refractive layers 15, 15a, 15b, 15c, and 15d include silicon oxide, the patterns may be formed using an ammonium fluoride-based etching ink, and when the refractive layers 15, 15a, 15b, 15c, and 15d include titanium oxide, the patterns may be formed using a phosphoric acid-based etching ink. For example, an ammonium fluoride-based etching ink may be useful for removing a portion of the refractive layers 15, 15a, 15b, 15c, and 15d by chemical reaction with silicon oxide components, and a phosphoric acid-based etching ink may be useful for removing a portion of the refractive layers 15, 15a, 15b, 15c, and 15d by chemical reaction with titanium oxide components.

According to certain embodiments, the refractive layers 15, 15a, 15b, 15c, and 15d may be sequentially formed by an electronic beam deposition technique. When the refractive layers 15, 15a, 15b, 15c, and 15d include different patterns, a deposition process and a patterning process may be alternately performed. For example, a first pattern may be formed on the first refractive layer 15a, a second pattern may be formed on the second refractive layer 15b, a third pattern may be formed on the third refractive layer 15c, and a fourth pattern may be formed on the fourth refractive layer 15d. The patterned refractive layers 15, 15a, 15b, 15c, and 15d may be randomly selected in the manufacturing process, and the pattern to be formed on each of the refractive layers 15, 15a, 15b, 15c, and 15d may be diversified.

According to certain embodiments, the refractive layers 15, 15a, 15b, 15c, and 15d may have different refractive indexes by implementation with different materials. For example, the first refractive layer 15a may have a first refractive index, being formed via silicon oxide ($SiO_x$), e.g., $SiO_2$, and the second refractive layer 15b may have a second refractive index higher than the first refractive index, by formation including titanium oxide ($TiO_x$), e.g., $TiO_2$. In some embodiments, the refractive layers 15, 15a, 15b, 15c, and 15d may be formed by alternately stacking at least one refractive layer including silicon oxide and at least one layer including titanium oxide.

According to certain embodiments, the refractive indexes of the refractive layers 15, 15a, 15b, 15c, and 15d may be varied depending on the component or content of the added material. For example, in the instant embodiment, refractive indexes depending on the components (e.g., silicon oxide or titanium oxide) included in the refractive layers 15, 15a, 15b, 15c, and 15d are described. However, other refractive layers, such as those having a third or fourth refractive index different from the first refractive index or the second refractive index, may be implemented depending on the content of the components.

According to certain embodiments, the light blocking layer 17 may be formed on a surface of at least one of the refractive layers 15, 15a, 15b, 15c, and 15d. For example, the refractive layers 15, 15a, 15b, 15c, and 15d may be sequentially stacked between the UV molding layer 13 and the light blocking layer 17, and the outermost refractive layer (e.g., the fourth refractive layer 15d) among the refractive layers 15, 15a, 15b, 15c, and 15d may be formed to contact the light blocking layer 17. In some embodiments, when an ornamental pattern is provided in which the fourth refractive layer 15d is at least partially removed, a portion of the light blocking layer 17 may be formed so as to contact the third refractive layer 15c.

According to certain embodiments, the light blocking layer 17 may substantially block light and may absorb or reflect the incident light from the external environment. According to an embodiment, the light blocking layer 17 may be implemented as a plurality of layers 17a, 17b, and 17c, and the plurality of layers 17a, 17b, and 17c may be formed with different colors of inks or paints. For example, among the plurality of layers, a first blocking layer 17a may be a white printed layer, a second blocking layer 17b may be a gray printed layer, and a third blocking layer 17c may be a black printed layer. The light blocking layer 17 may provide a background color to substantially hide the internal structure or components of the ornamental member 10 from the outside and to implement a clear color through the base film 11, the UV molding layer 13, and/or the refractive layers 15, 15a, 15b, 15c, and 15d.

Figure 3:
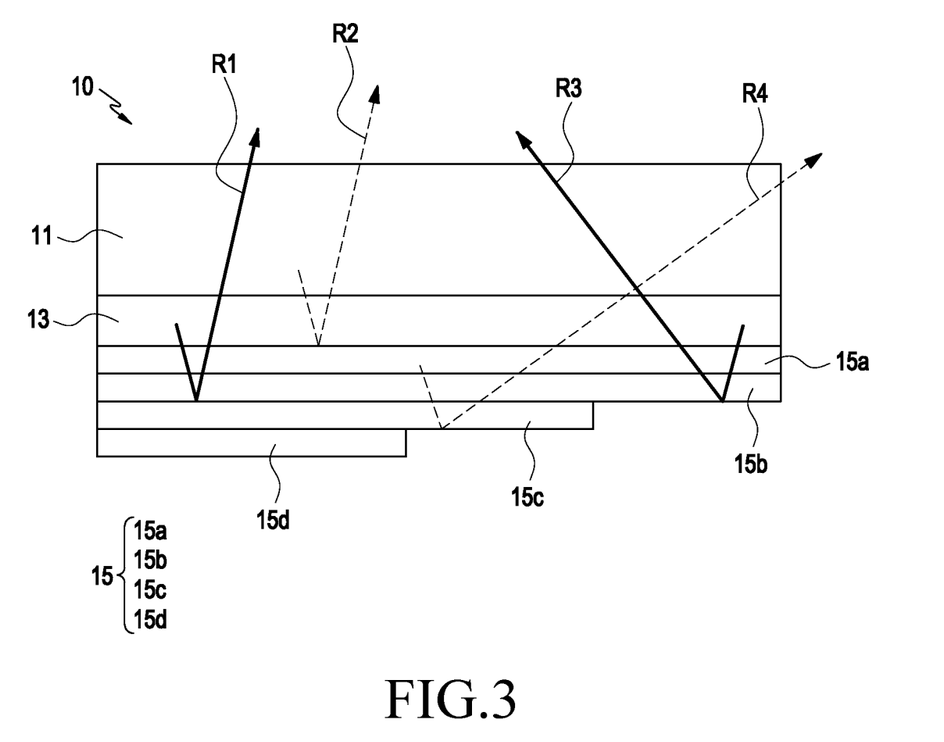
FIG. 3 is a cross-sectional view illustrating an example of an ornamental member according to certain embodiments of the disclosure.
Figure 4:
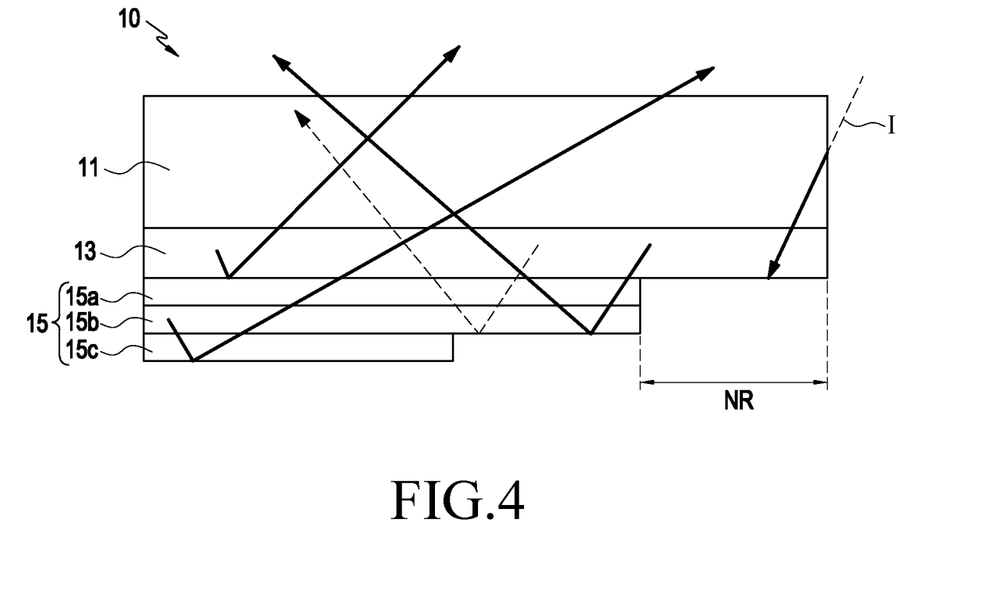
FIG. 4 is a cross-sectional view illustrating another example of an ornamental member according to certain embodiments of the disclosure.

FIG. 3 is a cross-sectional view illustrating an example of an ornamental member 10 (e.g., the ornamental member 10 of FIG. 1 and/or FIG. 2) according to certain embodiments of the disclosure. FIG. 4 is a cross-sectional view illustrating another example of an ornamental member 10 according to certain embodiments of the disclosure.

Referring to FIGS. 3 and 4, the rays R1, R2, R3, and R4 reflected by each layer (e.g., the base film 11, the UV molding layer 13, and/or the refractive layers 15, 15a, 15b, 15c, and 15d) of the ornamental member 10 and/or by the inter-layer interfaces may be combined to implement various visual effects. For example, although the light is incident along a same path, a first portion of the light may be reflected or refracted by the optical pattern 13a, and another portion of the light may be reflected or refracted by the refractive layers 15, 15a, 15b, 15c, and 15d (or interfaces between the refractive layers) so as to propagate in different paths. In some embodiments, of the light that is incident along the same path, a portion reflected by the first refractive layer 15a and another portion reflected by the fourth refractive layer 15d may nonetheless have different textures (e.g., illuminance or saturation). For example, since the light reflected by the fourth refractive layer 15d has already come to the fourth refractive layer 15d through the first, second, and third refractive layers 15a, 15b, and 15c, and then propagates to the exterior environment through the third, second, and first refractive layers 15c, 15b, and 15a, although incident in the same path, it may have a different texture from the portion of light reflected by the first refractive layer 15a. In another embodiment, the ray R1 incident or reflected along a first path may be reflected or refracted via the interface disposed between the second refractive layer 15b and the third refractive layer 15c, and the ray R2 incident or reflected in a second path that is different from the first path may be reflected or refracted by the UV molding layer 13

(e.g., the optical pattern 13a of FIG. 2) or the interface disposed between the UV molding layer 13 and the first refractive layer 15a, so that they propagate along the same path or along parallel paths, causing interference. As such, when the ornamental member 10 includes the plurality of refractive layers 15, 15a, 15b, 15c, and 15d and/or the optical pattern 13a, it may provide a variety of visual patterns and/or colors.

According to certain embodiments, the refractive layers 15, 15a, 15b, 15c, and 15d may not be formed within a partial area (e.g., as seen in FIG. 4; hereinafter, 'non-reflection area' or 'NR' area) in the inner surface of the base film 11 or the inner surface of the UV molding layer 13. In the non-reflection area NR, the light blocking layer (e.g., the light blocking layer 17 of FIG. 2) may be formed so as to substantially contact the inner surface of the UV molding layer 13 or the inner surface of the base film 11, and the light 1 incident on the non-reflection area NR may be substantially absorbed by the light blocking layer 17. In another embodiment, although light is incident on the area with the refractive layers 15, 15a, 15b, 15c, and 15d not formed (e.g., the non-reflection area NR), a portion of the light may be reflected by the light blocking layer 17. In an embodiment, the non-reflection area NR has various characters or figures, which may provide an additional ornamental or visual effect to the exterior of the ornamental member 10.

Figure 5:
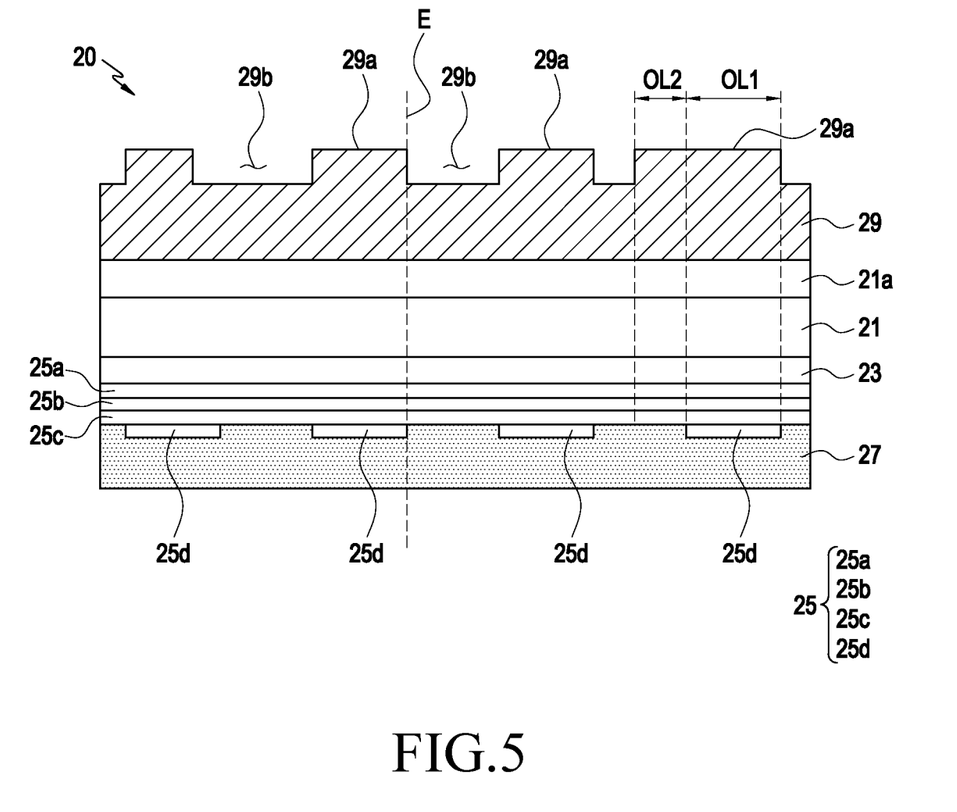
FIG. 5 is a cross-sectional view illustrating still another example of an ornamental member according to certain embodiments of the disclosure.

FIG. 5 is a cross-sectional view illustrating another example of an ornamental member 10 (e.g., the ornamental member 10 of FIGS. 1 to 4) according to certain embodiments of the disclosure.

Referring to FIG. 5, an ornamental member 20 may include a transparent plate 29, a base film 21 (e.g., the base film 11 of FIGS. 2 to 4) bonded to one surface of the transparent plate 29 via an adhesive layer 21a, a UV molding layer 23 (e.g., the UV molding layer 13 of FIGS. 2 to 4) formed on a surface of the base film 21, and/or refractive layers 25, 25a, 25b, 25c, and 25d. The transparent plate 29 may include a protruding pattern 29a and a recessed pattern 29b formed on the other surface (e.g., outer surface). The protruding pattern 29a or the recessed pattern 29b may be combined with, e.g., an optical pattern (e.g., the optical pattern 13a of FIG. 2) and/or the refractive layers 25, 25a, 25b, 25c, and 25d (e.g., the refractive layers 15, 15a, 15b, 15c, and 15d of FIGS. 2 to 4) to provide an additional visual effect.

According to certain embodiments, the protruding pattern 29a or the recessed pattern 29b may be implemented by visualization of, for example, a character, a figure, and/or a natural phenomenon. In an embodiment, when the transparent plate 29 is viewed from outside, an edge of the protruding pattern 29a or the recessed pattern 29b may at least partially be aligned (E) with an edge of any one (e.g., the fourth refractive layer 25d) of the refractive layers 25, 25a, 25b, 25c, and 25d. For example, as at least a portion of the pattern formed on the fourth refractive layer 25d is aligned with the protruding pattern 29a or the recessed pattern 29b, the pattern provided by the fourth refractive layer 25d may be more clearly visible to a user.

According to certain embodiments, the edge of the protruding pattern 29a or the recessed pattern 29b may be disposed to cross, intersect or otherwise be misaligned with the edge of any one of the refractive layers 25, 25a, 25b, 25c, and 25d. For example, a portion (e.g., a first ornamental area OL1) of the protruding pattern 29a may be disposed so as to overlap the fourth refractive layer 25d, and the other portion (e.g., a second ornamental area OL2) of the protruding pattern 29a may be aligned to an area where the fourth refractive layer 25d is not formed. For example, in the structure in which the protruding pattern 29a is visually and tactilely exposed, the two different areas OL1 and OL2 of the protruding pattern 29a may provide different visual effects, according to their respective states of alignment with the fourth refractive layer 25d. As such, according to certain embodiments of the disclosure, a combination of the plurality of refractive layers 25, 25a, 25b, 25c, and 25d, the refractive index and surface area of the refractive layers 25, 25a, 25b, 25c, and 25d, the optical pattern of the UV molding layer 23, and/or the transparent plate 29 (e.g., the protruding pattern 29a or the recessed pattern 29b) may be thus combined to provide varied visual ornamental effects to the exterior.

Figure 6:
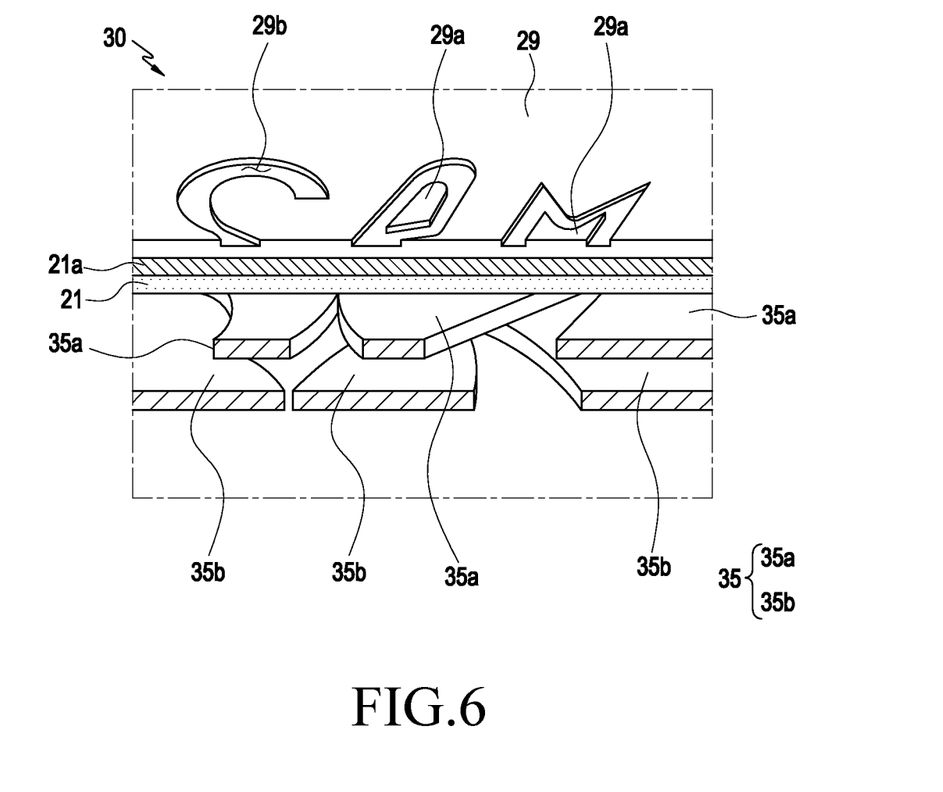
FIG. 6 is a view illustrating an example of a pattern formed on each layer when a portion of an ornamental member is cut according to certain embodiments of the disclosure.

FIG. 6 is a view illustrating an example of a pattern formed on each layer, when a portion of an ornamental member 30 (e.g., the ornamental member 10 or 20 of FIGS. 1 to 5) is cut according to certain embodiments of the disclosure.

In the illustrated embodiment, a configuration in which an ornamental member 30 includes two refractive layers 35a and 35b (e.g., the refractive layers 15 and 25 of FIGS. 2 to 5) is illustrated, but certain embodiments of the disclosure are not limited thereto, and it is understood that the actual number of refractive layers may be diversified. Although FIG. 6 exemplifies that the refractive layers 35, 35a, and 35b are separated, it should be noted that this arrangement illustrates the pattern implemented on each refractive layer 35, 35a, and 35b. For example, the refractive layers 35, 35a, and 35b exemplified in FIG. 6 may be formed or arranged to contact each other and may be any one of the refractive layers 15 and 25 of FIGS. 2 to 5.

Referring to FIG. 6, the ornamental member 30 may include a transparent plate 29, an adhesive layer 21a, a base film 21, and a plurality of refractive layers 35, 35a, and 35b. Although not shown, a UV molding layer 13 or 23 of FIGS. 2 to 5 may be formed on a surface, e.g., inner surface, of the base film 21. The transparent plate 29 may substantially transmit light, and may include a protruding pattern 29a or a recessed pattern 29b formed on the outer surface thereof. The recessed pattern 29b may be depressed or protruding from the outer surface of, for example, the transparent plate 29, and may visually or tactilely implement a shape of an alphanumeric character. The adhesive layer 21a may include, for example, an optical clear adhesive (OCA), a pressure sensitive adhesive (PSA), a heat sensitive adhesive (HSA), and/or a double-sided tape. The adhesive layer 21a may adhere, for example, the base film 21 to the transparent plate 29 (e.g., the inner surface), and may be implemented so as to substantially transmit light.

According to certain embodiments, among the refractive layers 35, 35a, and 35b, the first refractive layer 35a may be formed on the inner surface of the base film 21 (or the inner surface of the UV molding layer 13 of FIG. 2), and a portion thereof may be removed by an etching ink. For example, the first refractive layer 35a may form a designated pattern when viewed from the exterior of the transparent plate 29. According to an embodiment, when viewed from the exterior of the transparent plate 29, a portion of the edge of the first refractive layer 35a or the pattern implemented by the first refractive layer 35a may be aligned with the edge of the recessed pattern 29b (e.g., refer to the portion indicated by 'E' in FIG. 5), and another portion of the edge of the first refractive layer 35a or the pattern implemented by the first refractive layer 35a may cross and/or intersect with the edge of the recessed pattern 29b. In another embodiment, the first refractive layer 35a may include a first refractive index by implementation using either silicon oxide or titanium oxide.

According to certain embodiments, among the refractive layers 35, 35a, and 35b, the second refractive layer 35b may be formed on a surface (e.g., inner surface) of the first refractive layer 35a and a portion thereof may be removed by the etching ink so that various patterns may be formed, as viewed from an exterior of the transparent plate 29. In an embodiment, as viewed from the exterior of the transparent plate 29, the edge of the second refractive layer 35b or the pattern implemented by the second refractive layer 35b may be aligned with, or cross, the edge of the recessed pattern 29b or the first refractive layer 35a. In another embodiment, the pattern formed by the second refractive layer 35b may differ from the pattern formed by the first refractive layer 35a. For example, the second refractive layer 35b may be formed so as to have an surface area different from the surface area of the first refractive layer 35a.

In another embodiment, the patterns formed by the first refractive layer 35a and the second refractive layer 35b may be substantially the same as each other, and the surface areas of the first refractive layer 35a and the second refractive layer 35b may be identical to each other. In this case, the pattern of the first refractive layer 35a and the pattern of the second refractive layer 35b may be aligned in different positions. For example, the pattern of the second refractive layer 35b and the pattern of the first refractive layer 35a may be arranged so as to be symmetrical vertically or horizontally. In another embodiment, the second refractive layer 35b may have a second refractive index by including an alternative material to that of the other refractive layer (e.g., one of silicon oxide or the titanium oxide, depending on whether the other layer is formed of titanium oxide or silicon oxide, respectively).

Although not shown, the ornamental member 30 may further include an additional refractive layer, and the additional refractive layer may provide a visual ornamentation, such as another design, character, or figure. As such, the ornamental member 30 may provide various visual effects through the transparent plate 29, the base film 21, the UV molding layer (e.g., the UV molding layer 13 or 23 of FIGS. 2 to 5), and/or the refractive layers 35, 35a, and 35b. For example, light incident from the exterior may be transmitted through the transparent plate 29 and be partially transmitted, refracted, or reflected by the UV molding layer 13 or 23 (e.g., the optical pattern 13a of FIG. 2) or the refractive layers 35, 35a, and 35b, and the patterns or colors of the layers may be combined in various manners to provide a visual ornamentation.

Figure 7:
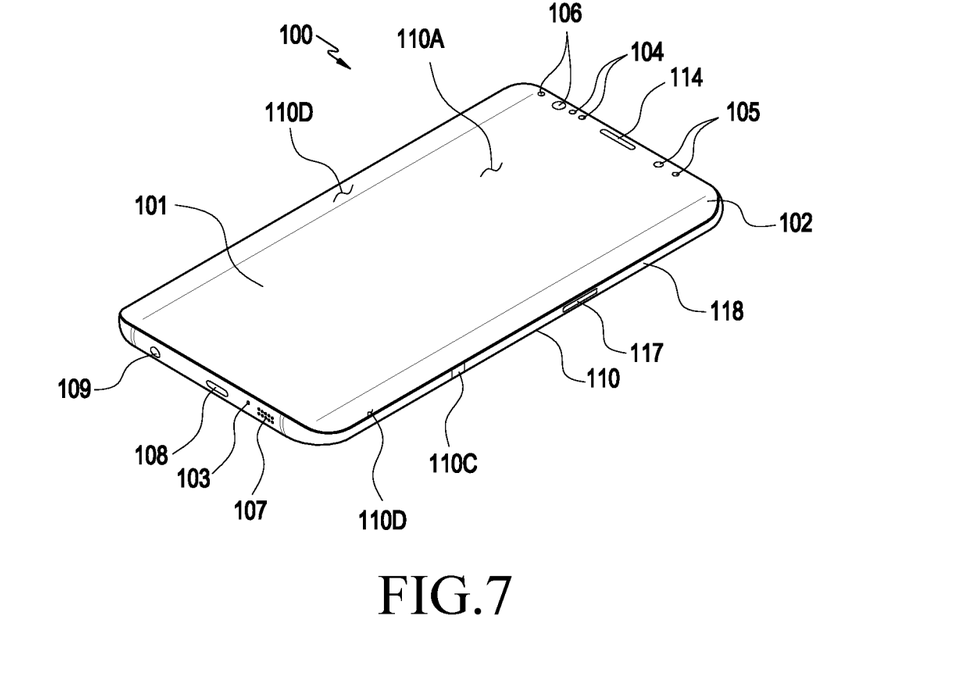
FIG. 7 is a front perspective view illustrating an electronic device including an injection-molded article according to certain embodiments of the disclosure.
Figure 8:
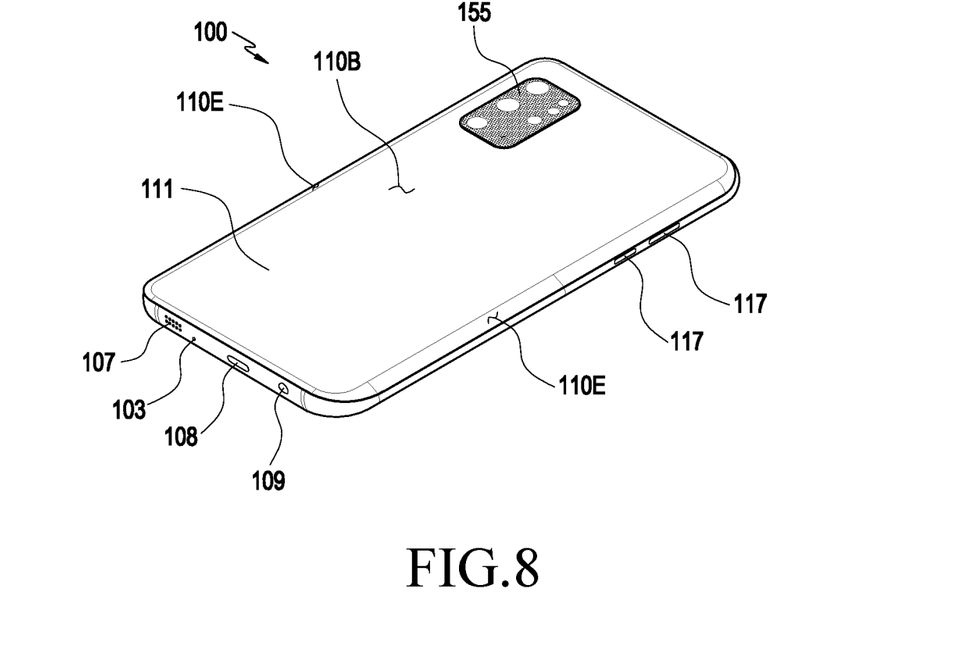
FIG. 8 is a rear perspective view illustrating an electronic device including an injection-molded article according to certain embodiments of the disclosure.

FIG. 7 is a front perspective view illustrating an electronic device 100 including an ornamental member (e.g., the ornamental member 10, 20, or 30 of FIGS. 1 to 6) according to certain embodiments of the disclosure. FIG. 8 is a rear perspective view illustrating an electronic device 100 including an ornamental member 10, 20, or 30 according to certain embodiments of the disclosure.

Referring to FIGS. 7 and 8, according to an embodiment, an electronic device 100 may include a housing 110 including a first surface (or front surface) 110A, a second surface (or rear surface) 110B, and a side surface 110C surrounding a space between the first surface 110A and the second surface 110B. According to another embodiment (not shown), the housing may denote a structure forming the first surface 110A of FIG. 7, the second surface 110B of FIG. 8, and some of the side surfaces 110C. According to an embodiment, the first surface 110A may be formed via a front plate 102 (e.g., a glass plate or polymer plate with various coat layers) at least part of which is substantially transparent. According to another embodiment, the front plate 102 may be coupled with the housing 110 and, with the housing 110, together define an internal space. According to certain embodiments, the 'internal space' may indicate a hollow within the housing 110 for receiving at least part of the display 101.

According to certain embodiments, the second surface 110B may be formed of a substantially opaque rear plate 111. The rear plate 111 may be formed of, e.g., laminated or colored glass, ceramic, polymer, metal (e.g., aluminum, stainless steel (STS), or magnesium), or a combination of at least two thereof. In another embodiment, the rear plate 111 may be at least partially formed by the above-described ornamental member (e.g., the ornamental member 10, 20, or 30 of FIGS. 1 to 6). The side surface 110C may be formed by a side bezel structure (or a "side member") 118 that couples to the front plate 102 and the rear plate 111 and includes a metal and/or polymer. According to certain embodiments, the rear plate 111 and the side bezel structure 118 may be integrally formed together and include the same material (e.g., a metal, such as aluminum).

In the embodiment illustrated, the front plate 102 may include two first areas 110D (e.g., curved areas), which may seamlessly extend from the first surface 110A to the rear plate 111, on both the long edges of the front plate 102. In the embodiment illustrated, the rear plate 111 may include second areas 110E (e.g., curved areas), which extend from the second surface 110B to the front plate 102, on both the long edges. In some embodiments, the seamless extension thereof may include a curvature or "bend." According to various embodiment, the front plate 102 (or the rear plate 111) may include one of the first areas 110D (or the second areas 110E). In another embodiment, some of the first areas 110D or the second areas 110E may omitted. In the above-described embodiments, at side view of the electronic device 100, the side bezel structure 118 may include a first thickness (or width) for sides (e.g., the side where the connector hole 108 is formed) that do not have the first areas 110D or the second areas 110E and a second thickness, which is smaller than the first thickness, for sides (e.g., the side where the key input device 117 is disposed) that have the first areas 110D or the second areas 110E.

According to an embodiment, the electronic device 100 may include at least one or more of a display 101, audio modules 103, 107, and 114, a sensor module 104, camera modules 105 and 155, a key input device 117, a light emitting device 106, and connector holes 108 and 109. According to certain embodiments, the electronic device 100 may exclude at least one (e.g., the key input device 117 or the light emitting device 106) of the components or may add other components.

The display 101 may be visually exposed through a portion of the front plate 102. According to an embodiment, at least a portion of the display 101 may be exposed through the front plate 102 forming the first surface 110A and the first areas 110D of the side surface 110C. According to certain embodiments, an edge of the display 101 may be formed so as to be substantially the same shape as an adjacent outer edge of the front plate 102. According to an embodiment, the surface (or the front plate 102) of the housing 110 may include a screen display area formed as the display 101 which may be visually exposed. For example, the screen display area may include the front surface 110A and first areas 110D. According to an embodiment (not shown), the interval between the outer edge of the display 101 and the outer edge of the front plate 102 may remain substantially even, to give a larger area of exposure the display 101.

According to another embodiment (not shown), the screen display area (e.g., the active area), or an area (e.g., the inactive area) off the screen display area, of the display 101 may include a recess or opening in a portion thereof, and at least one or more of the audio module 114, sensor module 104, camera modules 105 and 155, and light emitting device 106 may be aligned with the recess or opening. According to another embodiment (not shown), at least one or more of the audio module 114, sensor module 104, camera modules 105 and 155, and light emitting device 106 may be included on the rear surface of the screen display area of the display 101. In an embodiment, the electronic device 100 may include a display (not shown) that is slidably disposed and provides a screen area (e.g., a display area). For example, the display area of the electronic device 100 may be visually exposed and may enable an image to be output. In one example, the electronic device 100 may adjust the display area according to the movement of a sliding plate (not shown) or a movement of the display. For example, such an example electronic device 100 may include a rollable component configured to selectively expand the display area as at least a portion (e.g., the housing 110) of the electronic device 100 is operable to slide or retract relative to a housing thereof. The above-described display 101 may be referred to as, e.g., a slide-out display or an expandable display.

According to another embodiment (not shown), the display 101 may be disposed to be coupled with, or adjacent, a touch detecting circuit, a pressure sensor capable of measuring the strength (pressure) of touches, and/or a digitizer for detecting a magnetic field-type stylus pen. According to an embodiment, at least part of the sensor module 104 and/or at least part of the key input device 117 may be disposed in the first areas 110D and/or the second areas 110E.

The audio modules 103, 107, and 114 may include a microphone hole and speaker holes. The microphone hole may have a microphone inside to obtain external sounds. According to an embodiment, there may be a plurality of microphones to be able to detect the direction of a sound. The speaker holes may include an external speaker hole and a phone receiver hole. According to an embodiment, the speaker holes and the microphone hole may be implemented as a single hole, or speakers may be rested without the speaker holes (e.g., piezo speakers).

The sensor module 104 may produce an electrical signal or data value corresponding to the internal operation state or external environment state of the electronic device 100. The sensor module 104 may include a first sensor module 104 (e.g., a proximity sensor) and/or a second sensor module (not shown) (e.g., a fingerprint sensor) disposed on the first surface 110A of the housing 110 and/or another sensor module (not shown) (e.g., an HRM sensor or fingerprint sensor) disposed on the second surface 110B of the housing 110. The fingerprint sensor may be disposed on the second surface 110A as well as on the first surface 110B (e.g., the display 101) of the housing 110. The electronic device 100 may further include sensor modules not shown, e.g., such as at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor 104.

The camera modules 105 and 155 may include a first camera device 105 disposed on the first surface 110A of the electronic device 100 and a second camera device 155 disposed on the second surface 110B. The second camera device 155 may include, for example, an infrared light source, an infrared receiver, a flicker detection sensor, and/or a plurality of cameras. The camera modules 105 and 155 may include one or more lenses, an image sensor, and/or an image signal processor. A flash (not shown) may be disposed on the second surface 110B. The flash may include, e.g., a light emitting diode (LED) or a xenon lamp. According to an embodiment, two or more lenses (an infrared (IR) camera, a wide-angle lens, and a telescopic lens) and image sensors may be disposed on one surface of the electronic device 100.

The key input device 117 may be disposed on the side surface 110C of the housing 110. According to an embodiment, the electronic device 100 may exclude all or some of the above-mentioned key input devices 117 and the excluded key input devices 117 may be implemented in other forms, e.g., as soft keys, on the display 101.

The light emitting device 106 may be disposed on, for example, the first surface 110A of the housing 110. The light emitting device 106 may provide, e.g., information about the state of the electronic device 100 in the form of light. According to an embodiment, the light emitting device 106 may provide a light source that interacts with, e.g., the camera module 105. The light emitting device 106 may include, for example, a light emitting diode (LED), an infrared (IR) LED, or a xenon lamp.

The connector holes 108 and 109 may include a first connector hole 108 for receiving a connector (e.g., a universal serial bus (USB) connector) for transmitting or receiving power and/or data to/from an external electronic device and/or a second connector hole 109 (e.g., an earphone jack) for receiving a connector for transmitting or receiving audio signals to/from the external electronic device.

According to certain embodiments, the rear plate 111 and the side bezel structure 118 may be implemented using a kind of synthetic resin, e.g., an ornamental member (e.g., the ornamental member 10, 20, or 30 of FIGS. 1 to 6). According to an embodiment, the rear plate 111 and the side bezel structure 118 may include the transparent plate 29, the base film 11 or 21, the UV molding layer 13 or 23, the optical pattern 13a, the refractive layer 15, 25, or 35, and/or the light blocking layer 17 or 27 of FIGS. 1 to 6. For example, the above-described electronic device 100 may provide various visual effects by including the rear plate 111 manufactured based on the ornamental member 10, 20, or 30 of FIGS. 1 to 6 and/or the side bezel structure 118.

As described above, according to certain embodiments of the disclosure, an electronic device (e.g., the electronic device 100 of FIG. 7 or 8) may comprise a housing (e.g., the housing 110 of FIG. 7 or 8), a front plate (e.g., the ornamental member 10 of FIG. 1 or the front plate 102 of FIG. 7) disposed on one surface of the housing, and a rear plate (e.g., the ornamental member 10 of FIG. 1 or the rear plate 111 of FIG. 8) disposed on a rear surface of the housing. At least one of the front plate and the rear plate may include a transparent plate (e.g., the transparent plate 29 of FIG. 5 or 6) configured to at least partially transmit light, a base film (e.g., the base film 11 or 21 of FIGS. 2 to 6) attached to one surface of the transparent plate and configured to at least partially transmit light, a UV molding layer (e.g., the UV molding layer 13 or 23 of FIGS. 2 to 5) formed on a surface of the base film, and a plurality of refractive layers (e.g., the refractive layer 15, 25, or 35 of FIGS. 2 to 6) sequentially stacked on a surface of the UV molding layer. At least one (e.g., the fourth refractive layer 15d or 25d of FIG. 2 or 5 or any one of the refractive layers 35, 35a, and 35b of FIG. 6)

of the refractive layers may be formed to have a different refractive index and a different surface area from the rest of the refractive layers.

According to certain embodiments, at least one selected from among the refractive layers may be formed with a different thickness from the rest of the refractive layers.

According to certain embodiments, the UV molding layer may include an optical pattern (e.g., the optical pattern 13a of FIG. 2) formed on a surface thereof.

According to certain embodiments, among the refractive layers, two refractive layers (e.g., the third refractive layer 15c or 25c and the fourth refractive layer 15d or 25d of FIGS. 2 and 5 or the refractive layers 35, 35a, and 35b of FIG. 6) disposed to abut each other may be formed with different surface areas.

According to certain embodiments, the refractive layers may include at least one first refractive layer with a first refractive index and at least one second refractive layer with a second refractive index different from the first refractive index. The first refractive layer and the second refractive layer may be alternately stacked on a surface of the UV molding layer.

According to certain embodiments, the first refractive layer may include silicon oxide ($SiO_x$), and the second refractive layer includes titanium oxide ($TiO_x$).

According to certain embodiments, the transparent plate may include a protruding pattern (e.g., the protruding pattern 29a of FIGS. 5 and 6) or a recessed pattern (e.g., the recessed pattern 29b of FIGS. 5 and 6) formed on another surface thereof.

According to certain embodiments, when viewed from outside the rear plate, an edge of the protruding pattern or the recessed pattern may be at least partially aligned with an edge of any one of the refractive layers (e.g., refer to the portion indicated by 'E' of FIG. 5).

According to certain embodiments, when viewed from outside the rear plate, an edge of the protruding pattern or the recessed pattern may be disposed to cross an edge of any one of the refractive layers (e.g., refer to the arrangement of the areas OL1 and OL2 of FIG. 5 or the refractive layers 35a and 35b of FIG. 6).

According to certain embodiments, the electronic device may further comprise a light blocking layer (e.g., the light blocking layer 17 or 27 of FIG. 2 or 5) formed on a surface of any one of the refractive layers and disposed to face the UV molding layer, with the refractive layers interposed therebetween.

According to certain embodiments of the disclosure, an ornamental member (e.g., the ornamental member 10, 20, or 30 of FIGS. 1 to 6, the front plate 102 of FIG. 7 or the rear plate 111 of FIG. 8) and/or an electronic device (e.g., the electronic device 100 of FIG. 7 or 8) including the same may comprise a base film (e.g., the base film 11 or 21 of FIGS. 2 to 6), a UV molding layer (e.g., the UV molding layer 13 or 23 of FIGS. 2 to 5) formed on a surface of the base film, and a plurality of refractive layers (e.g., the refractive layer 15, 25, or 35 of FIGS. 2 to 6) sequentially stacked on a surface of the UV molding layer. At least one (e.g., the fourth refractive layer 15d or 25d of FIG. 2 or 5 or any one of the refractive layers 35, 35a, and 35b of FIG. 6) of the refractive layers may be formed to have a different refractive index and a different surface area from the rest of the refractive layers.

According to certain embodiments, at least one selected from among the refractive layers may be formed with a different thickness from the rest of the refractive layers.

According to certain embodiments, the UV molding layer may include an optical pattern (e.g., the optical pattern 13a of FIG. 2) formed on a surface thereof.

According to certain embodiments, among the refractive layers, two refractive layers (e.g., the third refractive layer 15c or 25c and the fourth refractive layer 15d or 25d of FIGS. 2 and 5 or the refractive layers 35, 35a, and 35b of FIG. 6) disposed to abut each other may be formed with different surface areas.

According to certain embodiments, the refractive layers may include at least one first refractive layer with a first refractive index and at least one second refractive layer with a second refractive index different from the first refractive index. The first refractive layer and the second refractive layer may be alternately stacked on a surface of the UV molding layer.

According to certain embodiments, the first refractive layer may include silicon oxide, and the second refractive layer includes titanium oxide.

According to certain embodiments, the UV molding layer or the refractive layers may be configured to at least partially reflect light incident from an outside and transmitted through the base film.

According to certain embodiments, the ornamental member and/or the electronic device including the same may further comprise a transparent plate (e.g., the transparent plate 29 of FIG. 5 or 6). Another surface of the base film may be bonded to face an inner surface of the transparent plate.

According to certain embodiments, the transparent plate may include a protruding pattern (e.g., the protruding pattern 29a of FIGS. 5 and 6) or a recessed pattern (e.g., the recessed pattern 29b of FIGS. 5 and 6) formed on an outer surface thereof.

According to certain embodiments, the ornamental member may further comprise a light blocking layer (e.g., the light blocking layer 17 or 27 of FIG. 2 or 5) formed on a surface of any one of the refractive layers and disposed to face the UV molding layer, with the refractive layers interposed therebetween.

While the disclosure has been described and shown in connection with certain embodiments, it should be appreciated that certain embodiments are intended as limiting the disclosure but as illustrative. It will be apparent to one of ordinary skill in the art that various changes may be made in form and detail without departing from the disclosure, including the appended claims and their equivalents.

What is claimed is:

1. An electronic device, comprising:
   a housing;
   a front plate disposed on one surface of the housing; and
   a rear plate disposed on a rear surface of the housing,
   wherein at least one of the front plate and the rear plate includes:
      a transparent plate configured to at least partially transmit light,
      a base film attached to one surface of the transparent plate and configured to at least partially transmit light,
      an ultra-violet (UV) molding layer formed on a surface of the base film,
      a plurality of refractive layers sequentially stacked on a surface of the UV molding layer, and
      a light-blocking layer stacked on a terminal layer of the plurality of refractive layers, and
   wherein, the plurality of refractive layers include:
      a first plurality of refractive layers sequentially stacked on a surface of the UV molding layer, and a second plurality of refractive layers disposed at regular intervals or irregular intervals between the light-blocking layer and a terminal layer of the first plurality of refractive layers, and wherein at least one of the plurality of refractive layers is formed to have a different refractive index and each of the second plurality of refractive layers is formed to have a surface area smaller than a surface area of each of the first plurality of refractive layers.

2. The electronic device of claim 1, wherein at least one of the refractive layers from among the plurality of refractive layers is formed with a different thickness from the rest of the refractive layers, and wherein the first plurality of refractive layers are stacked along a first axis, and wherein the second plurality of refractive layers are disposed at regular intervals or irregular intervals along a second axis perpendicular to the first axis between the light-blocking layer and the terminal layer of the first plurality of refractive layers.

3. The electronic device of claim 1, wherein the UV molding layer includes an optical pattern formed on a surface thereof.

4. The electronic device of claim 1, wherein two refractive layers from among the plurality of refractive layers are disposed to abut each other, and are formed with different surface areas.

5. The electronic device of claim 1, wherein the plurality of refractive layers include at least a first refractive layer having a first refractive index, and a second refractive layer having a second refractive index different from the first refractive index, and wherein the first refractive layer and the second refractive layer are alternately stacked on a surface of the UV molding layer.

6. The electronic device of claim 5, wherein the first refractive layer includes silicon oxide ($SiO_x$), and the second refractive layer includes titanium oxide ($TiO_x$).

7. The electronic device of claim 1, wherein the transparent plate includes a protruding pattern or a recessed pattern formed on another surface thereof.

8. The electronic device of claim 7, wherein an edge of the protruding pattern or the recessed pattern is at least partially aligned with an edge of any one of the plurality of refractive layers.

9. The electronic device of claim 7, wherein an edge of the protruding pattern or the recessed pattern is disposed to intersect with an edge of any one of the plurality of refractive layers.

10. The electronic device of claim 1, further comprising:
a light blocking layer formed on a surface of any one of the plurality of refractive layers, and disposed so as to face the UV molding layer, with the plurality of refractive layers interposed therebetween.

11. An ornamental member for an electronic device, the ornamental member comprising:
a base film;
an ultra-violet (UV) molding layer formed on a surface of the base film,
a plurality of refractive layers sequentially stacked on a surface of the UV molding layer, and
a light-blocking layer stacked on a terminal layer of the plurality of refractive layers, and wherein, the plurality of refractive layers include:
a first plurality of refractive layers sequentially stacked on a surface of the UV molding layer, and
a second plurality of refractive layers disposed at regular intervals or irregular intervals between the light-blocking layer and a terminal layer of the first plurality of refractive layers, and wherein at least one of the plurality of refractive layers is formed to have a different refractive index and each of the second plurality of refractive layers is formed to have a surface area smaller than a surface area of each of the first plurality of refractive layers.

12. The ornamental member of claim 11, wherein at least one of the refractive layers from among the plurality of refractive layers is formed with a different thickness from the rest of the refractive layers, and wherein the first plurality of refractive layers are stacked along a first axis, and wherein the second plurality of refractive layers are disposed at regular intervals or irregular intervals along a second axis perpendicular to the first axis between the light-blocking layer and the terminal layer of the first plurality of refractive layers.

13. The ornamental member of claim 11, wherein the UV molding layer includes an optical pattern formed on a surface thereof.

14. The ornamental member of claim 11, wherein two refractive layers from among the plurality of refractive layers are disposed to abut each other, and are formed with different surface areas.

15. The ornamental member of claim 11, wherein the plurality of refractive layers include at least a first refractive layer having a first refractive index, and a second refractive layer having a second refractive index different from the first refractive index, and wherein the first refractive layer and the second refractive layer are alternately stacked on a surface of the UV molding layer.

16. The ornamental member of claim 15, wherein the first refractive layer includes silicon oxide ($SiO_x$), and the second refractive layer includes titanium oxide ($TiO_x$).

17. The ornamental member of claim 11, wherein the UV molding layer and/or the plurality of refractive layers are configured to at least partially reflect incident light incident from an external environment and transmitted through the base film.

18. The ornamental member of claim 11, further comprising a transparent plate,
wherein another surface of the base film is bonded to face an inner surface of the transparent plate.

19. The ornamental member of claim 18, wherein the transparent plate includes a protruding pattern or a recessed pattern formed on an outer surface thereof.

20. The ornamental member of claim 11, further comprising a light blocking layer formed on a surface of any of the plurality of refractive layers and disposed so as to face the UV molding layer, with the plurality of refractive layers interposed therebetween.

* * * * *